(12) United States Patent
Kim et al.

(10) Patent No.: US 6,414,896 B1
(45) Date of Patent: Jul. 2, 2002

(54) SEMICONDUCTOR MEMORY DEVICE HAVING COLUMN REDUNDANCY SCHEME TO IMPROVE REDUNDANCY EFFICIENCY

(75) Inventors: Su-a Kim; Byung-sick Moon, both of Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/905,376

(22) Filed: Jul. 13, 2001

(30) Foreign Application Priority Data

Aug. 14, 2000 (KR) .............................. 00-46937

(51) Int. Cl.[7] ................................................ G11C 8/00
(52) U.S. Cl. .................................. 365/230.03; 365/200
(58) Field of Search ............................. 365/230.03, 200

(56) References Cited

U.S. PATENT DOCUMENTS

| | | | |
|---|---|---|---|
| 5,761,138 A | * 6/1998 | Lee et al. | 365/200 |
| 5,978,290 A | * 11/1999 | Fujita | 365/200 |
| 6,219,269 B1 | * 4/2001 | Fujita | 365/230.03 |

FOREIGN PATENT DOCUMENTS

| | | |
|---|---|---|
| JP | 3093097 | 4/1991 |
| JP | 4061099 | 2/1992 |

* cited by examiner

*Primary Examiner*—Trong Phan
(74) *Attorney, Agent, or Firm*—F. Chau & Associates, LLP

(57) ABSTRACT

A semiconductor memory device having a column redundancy scheme for improving redundancy efficiency includes sub memory blocks, a redundancy memory block, global data input output lines respectively associated with the sub memory blocks, a redundancy global data input output line and switches. Each of the sub memory blocks has a plurality of memory cells. The redundancy memory block has a plurality of redundancy memory cells. The data of selected memory cells of a sub memory block are transmitted to a corresponding global data input output line. The data of selected redundancy memory cells of the redundancy memory block are transmitted to the redundancy global data input output line. A switch switches the global data input output line to the redundancy global data input output line if a memory cell connected to the global data input output line is defective.

28 Claims, 11 Drawing Sheets

US 6,414,896 B1

SEMICONDUCTOR MEMORY DEVICE HAVING COLUMN REDUNDANCY SCHEME TO IMPROVE REDUNDANCY EFFICIENCY

BACKGROUND OF THE INVENTION

1. Field of the Invention

The present invention relates to semiconductor memory devices, and more particularly, to a semiconductor memory device having a column redundancy scheme which improves redundancy efficiency of the semiconductor memory device.

2. Description of the Related Art

A dynamic random access memory (DRAM) is made up of many memory cells. If a semiconductor memory device has even one defective cell of the many memory cells, the semiconductor memory device does not properly operate and is treated as a defective chip. The probability that defective cells occur in a memory device increases due to the recent trend of the high density integration and high speed operation of semiconductor memory devices. As a result, the wafer yield, a ratio of the number of non-defective chips to the total number of chips fabricated on a wafer, is reduced. The wafer yield is an important factor in determining the manufacturing cost of DRAM devices. Therefore, a need exists for a method of correcting defective memory cells in a semiconductor memory device to improve the wafer yield.

Generally, redundancy circuit is built in a semiconductor memory device to correct defective memory cells by replacing the defective memory cells with redundant memory cells. The redundancy circuit drives redundancy memory cell blocks arrayed in columns and rows and selects redundancy memory cells instead of defective cells. If a column and/or row address signal, which addresses a defective cell, is received, a redundancy memory cell is selected instead of the defective cell in a normal memory cell block.

A semiconductor memory device having a conventional column redundancy scheme is shown in FIG. 1. Referring to FIG. 1, a semiconductor memory device 100 includes a plurality of sub memory blocks 110, 120, 130 and 140 and redundancy memory blocks 115, 125, 135 and 145 respectively adjacent to the sub memory blocks 110, 120, 130 and 140. The bit lines of the sub memory blocks 110, 120, 130 and 140 and the bit lines of the redundancy memory blocks 115, 125, 135 and 145 are controlled by a column decoder/redundancy control circuit 150, so that they are connected to global data input output lines (hereinafter, referred to as GIO lines) 111, 121, 131 and 141. The GIO lines 111, 121, 131 and 141 are coupled to an input output pad unit 160 through reading sense amplifier/writing drivers 114, 124, 134 and 144, respectively, and carry data to be written to or read from the memory cells of a memory cell block selected among the sub memory blocks 110, 120, 130 and 140 or redundancy memory blocks 115, 125, 135 and 145.

FIG. 2 shows the GIO line 141 connected to the sub memory block 140 and the redundancy memory block 145 of FIG. 1, in greater detail. Referring to FIG. 2, the bit lines BL of the sub memory block 140 and the bit lines RBL of the redundancy memory block 145 are connected to GIO<i> lines (where i=0, 2, 4, 6) via a column selection circuit 240. The column selection circuit 240 is part of the column decoder/redundancy control circuit 150 of FIG. 1, which is described below in connection with the reading operation of the semiconductor memory device. The column selection circuit 240 includes first, second and third selection units 241, 242 and 243. The first selection unit 241 transmits data in the bit lines (BL) of the sub memory block 140 to the second selection unit 242 in response to a bank selection signal BDCAij. The second selection unit 242 transmits data in the bit lines (BL) of the sub memory block 140 from the first selection unit 241 to local data input output lines LIO<i> (where i=0, 2, 4, 6) by selectively responding to a column selection signal CSL<j> (where j is an integer from 0 to m). The third selection unit 243 transmits data on the local data input output lines LIO<i> (where i=0, 2, 4, 6) to the GIO lines in response to the bank selection signal BDCAij.

When a defective cell occurs in the sub memory block 140, it is replaced with a memory cell in the redundancy memory block 145. That is, a bit line connected to the defective cell is replaced with a bit line RBL in the redundancy memory block 145. In order to achieve this, the column selection circuit 240 further includes first and second redundancy selection units 244 and 245. The first redundancy selection unit 244 transmits data in the bit lines RBL of the redundancy memory block 145 to the second redundancy selection unit 245 in response to the bank selection signal BDCAij. The second redundancy selection unit 245 transmits data in the bit lines RBL of the redundancy memory block 145 received from the first redundancy selection unit 244 to the local data input output lines LIO<i> (where i=0, 2, 4, 6) by selectively responding to a redundancy column selection signal RCSL<j> (where j is an integer from 0 to n). The redundancy column selection signal RCSL<j> (where j is an integer from 0 to n) is generated corresponding to the column selection signal CSL<j> (where j is an integer from 0 to m). The data on the bit lines RBL of the redundancy memory block 145 from the local data input output lines LIO<i> (where i=0, 2, 4, 6) is transmitted to the GIO<i> lines (where i=0, 2, 4, 6) via the third selection unit 243. In this way, the detective cell of the sub memory block 140 is replaced with a memory cell of the redundancy memory block 145.

However, in the conventional column redundancy scheme, the redundancy memory blocks 115, 125, 135 and 145 are required to correct defective cells in the sub memory blocks 110, 120, 130 and 140. Thus, the number of memory cells in the redundancy memory blocks 115, 125, 135 and 145 increase to improve redundancy efficiency of a semiconductor memory device, so that the size of the semiconductor memory device increases.

Since each of the redundancy memory blocks 115, 125, 135 and 145 is corresponding to each of the sub memory blocks 110, 120, 130 and 140 in the conventional redundancy scheme, the redundancy efficiency is limited to a single sub memory block. Even if the adjacent sub memory blocks share the local data input output lines LIO<i> (where i=0, 2, 4, 6), the redundancy efficiency of a single redundancy memory block is limited to two sub memory blocks.

Therefore, a need exists for a redundancy scheme capable of improving redundancy efficiency without increasing the size of a semiconductor memory device.

SUMMARY OF THE INVENTION

To solve the above and other problems, it is an object of the present invention to provide a redundancy scheme capable of improving redundancy efficiency without increasing the size of a semiconductor memory device.

The above and other objects are achieved by a semiconductor memory device having a redundancy scheme according to the present invention. As a first embodiment of the present invention, a semiconductor memory device preferably includes a plurality of sub memory blocks having a plurality of memory cells; a redundancy memory block having a plurality of redundancy memory cells; a global data input output line for carrying data of selected memory cells of a sub memory block; a redundancy global data input output line for carrying data of selected redundancy memory cells of the redundancy memory block; and a switch for switching the global data input output line to the redundancy global data input output line if a memory cell connected to the global data input output line is defective.

As a second embodiment of the present invention, a semiconductor memory device preferably includes a plurality of sub memory blocks having a plurality of memory cells; local redundancy memory blocks having a plurality of local redundancy memory cells, each of the local redundancy memory blocks being adjacent to each of the sub memory blocks; a redundancy memory block having a plurality of redundancy memory cells; a global data input output line for carrying data of selected memory cells of a sub memory block or data of selected local redundancy memory cells of a local redundancy memory block; a redundancy global data input output line for carrying data of selected redundancy memory cells of the redundancy memory block; and a switch for switching the global data input output line to the redundancy global data input output line if a memory cell connected to the global data input output line is defective.

As a third embodiment of the present invention, a semiconductor memory device preferably includes an upper memory bank; a lower memory bank; a plurality of sub memory blocks having a plurality of memory cells, the plurality of sub memory blocks included in each of the upper and lower memory banks; a column decoder connected to each of the upper and lower memory banks for addressing bit lines of the memory cells within the sub memory blocks; a it redundancy memory block having a plurality of redundancy memory cells, the redundancy memory block included in each of the upper and lower memory banks; a global data input output line for carrying data of selected memory cells of a sub memory block; a redundancy global data input output line for carrying data of selected redundancy memory cells of the redundancy memory block; and a switch for switching the global data input output line to the redundancy global data input output line if a memory cell connected to the global data input output line is defective.

As a fourth embodiment of the present invention, a semiconductor memory device preferably includes an upper memory bank; a lower memory bank; a plurality of sub memory blocks having a plurality of memory cells, the plurality of sub memory blocks included in each of the upper and lower memory banks; local redundancy memory blocks each having a plurality of local redundancy memory cells, the local redundancy memory blocks included in each of the upper and lower memory banks; a redundancy memory block having a plurality of redundancy memory cells, the redundancy memory block included in each of the upper and lower memory banks; a column decoder connected to each of the upper and lower memory banks for addressing bit lines of the memory cells within the sub memory blocks; a global data input output line for carrying the data of selected memory cells of a sub memory block; a redundancy global data input output line for carrying data of selected redundancy memory cells of the redundancy memory block; and a switch for switching the global data input output line to the redundancy global data input output line if a memory cell connected to the global data input output line is defective.

A column redundancy scheme according to the present invention includes a switching unit between a global data input output line and a redundancy global data input output line, so that the area of a semiconductor memory device can be reduced while increasing the redundancy efficiency.

BRIEF DESCRIPTION OF THE DRAWINGS

The above and other objects and advantages of the present invention will become more apparent by describing in detail preferred embodiments thereof with reference to the attached drawings in which.

DESCRIPTION OF PREFERRED EMBODIMENTS

Figure 1:
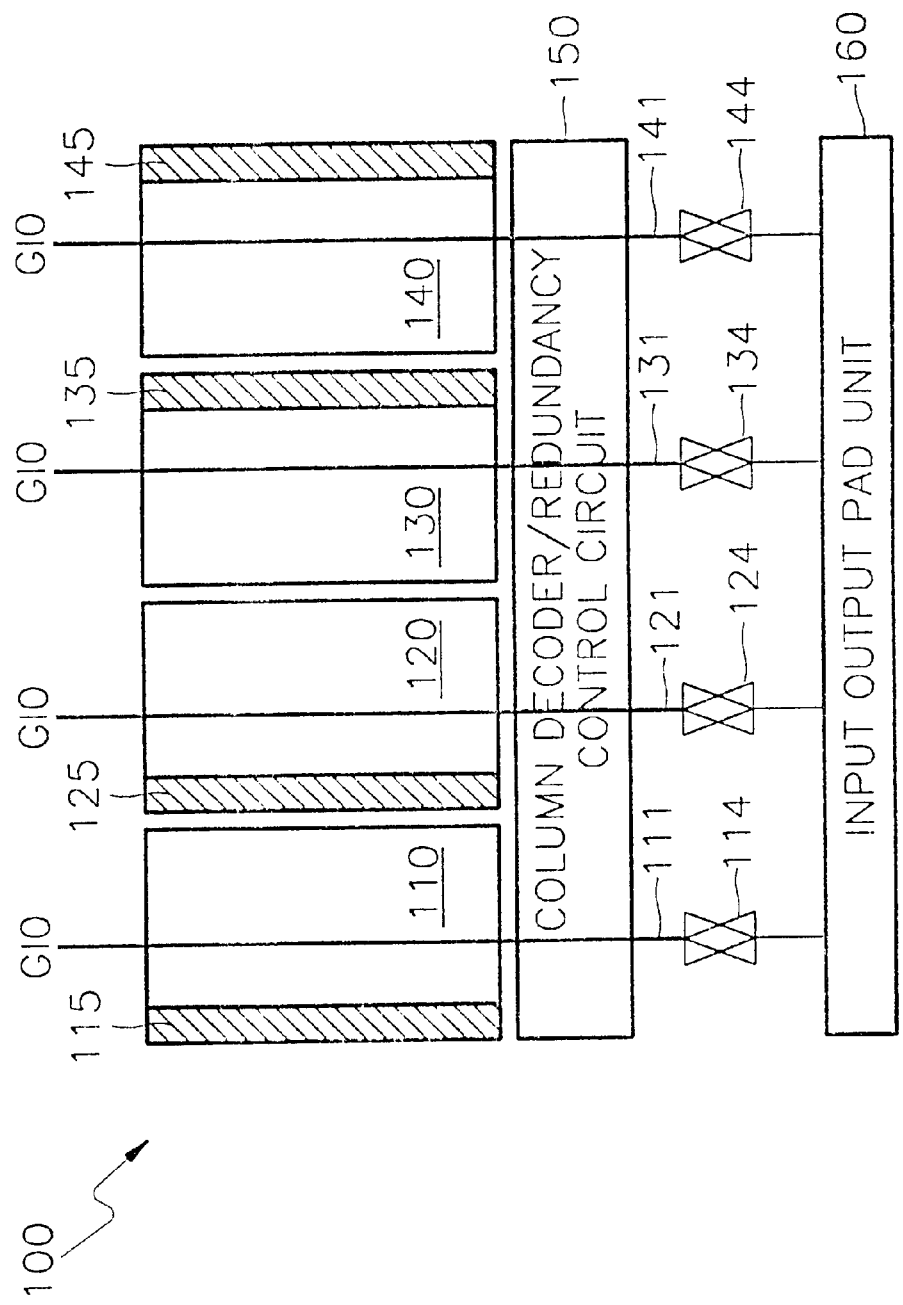
FIG. 1 shows a conventional column redundancy scheme.

Attached drawings for illustrating a preferred embodiment of the present invention, and the contents written on the attached drawings must be referred to in order to gain a sufficient understanding of the merits of the present invention and the operation thereof and the objectives accomplished by the operation of the present invention.

Hereinafter, the present invention will be described in detail by explaining preferred embodiments of the present invention with reference to the attached drawings. Like reference numerals in the drawings denote the same members.

FIRST EMBODIMENT

Figure 3:
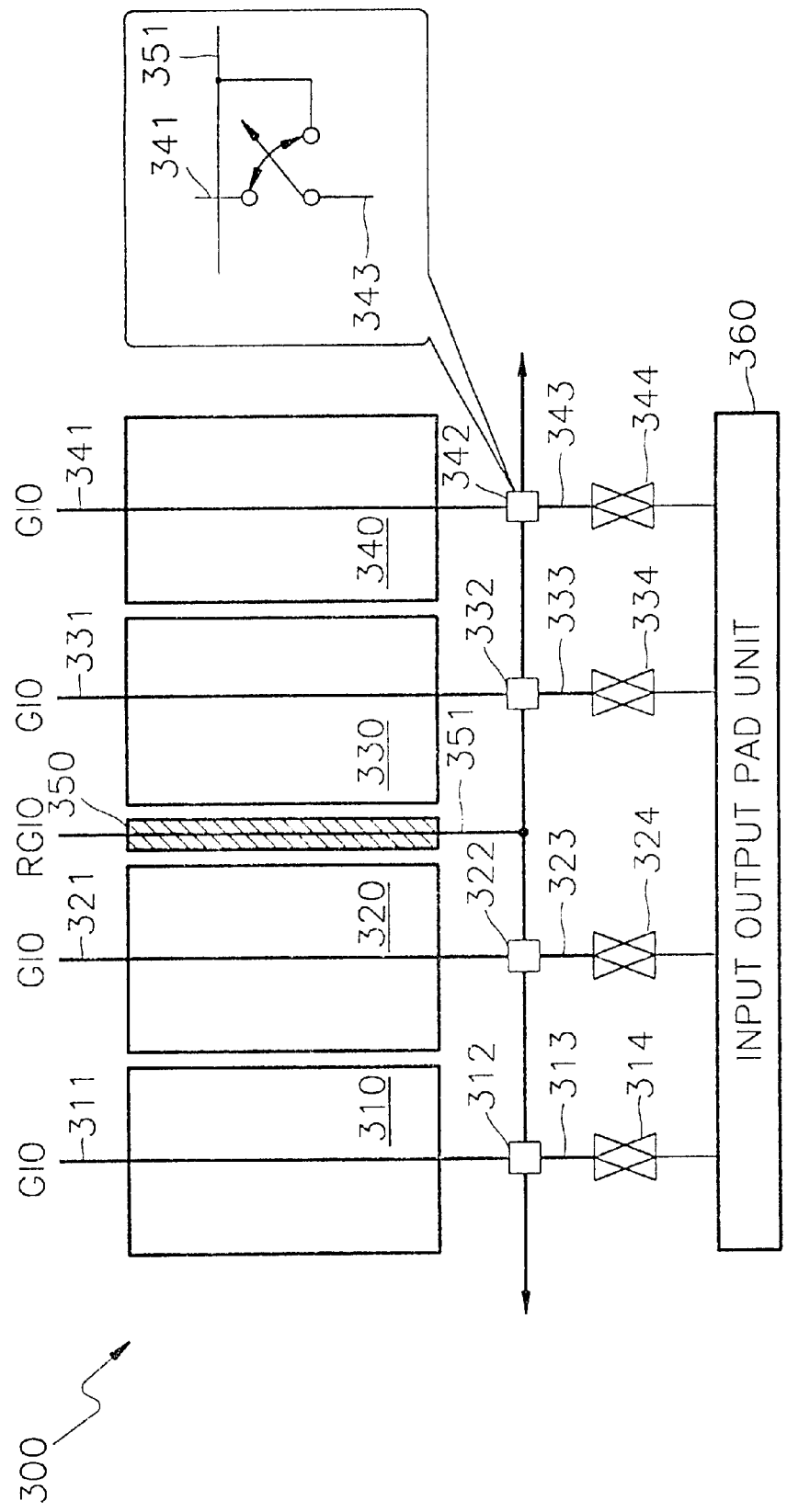
FIG. 3 shows a column redundancy scheme according to a first embodiment of the present invention.

FIG. 3 shows a column redundancy scheme according to a first embodiment of the present invention. In FIG. 3, a semiconductor memory device 300 includes a plurality of sub memory blocks 310, 320, 330 and 340 and a redundancy memory block 350. The redundancy memory block 350 is preferably located between the sub memory blocks 320 and 330. A plurality of memory cells are arrayed in a matrix structure having columns and rows in each of the sub memory blocks 310, 320, 330 and 340, and the data of the memory cells are input and output via global data input output lines (hereinafter, referred to as GIO lines) 311, 321, 331 and 341. The redundancy memory block 350 includes a plurality of redundancy memory cells, and the redundancy memory cells are input and output via a redundancy global data input output line (hereinafter, referred to as an RGIO line) 351.

Switches 312, 322, 332 and 342 are preferably connected between the GIO lines 311, 321, 331 and 341 and the RGIO line 351 and the data input out lines 313, 323, 333 and 343. The switches 312, 322, 332 and 342 are controlled by a switch controller (not shown) to connect the data input out lines 313, 323, 333 and 343 to the GIO lines 311, 321, 331 and 341 or to the RGIO line 351. The switch controller provides a control signal to the respective switches 312, 322, 332, 342 to correct defective cells in the sub memory blocks 310, 320, 330 and 340 with redundancy memory cells within the redundancy memory block 350. For example, the switch 342 selectively connects the data input output line 343 to the GIO line 341 of the sub memory block 340 or the RGIO line 351 of the redundancy memory block 350 under the control of the switch controller.

The data input output lines 313, 323, 333 and 343 are connected to reading sense amplifier/writing drivers 314, 324, 334 and 344, respectively. Data read from or to be written into memory cells are input or output from/to an input output pad unit 360 via the data input output lines 313, 323, 333, 343.

Figure 4:
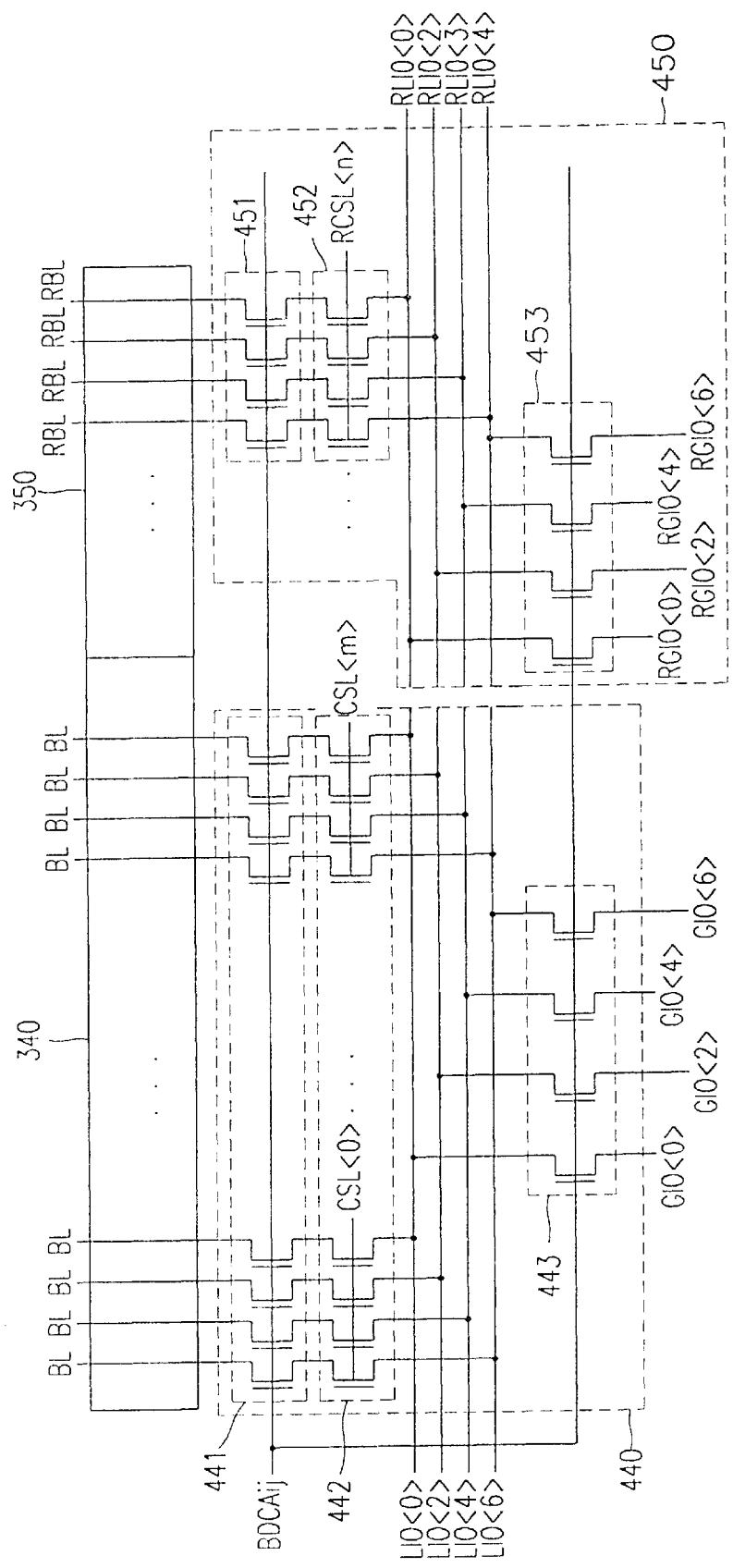
FIG. 4 shows GIO lines and redundancy GIO (RGIO) lines that are connected to a sub memory block and a redundancy memory block of FIG. 3, in greater detail.

FIG. 4 shows GIO lines and redundancy GIO (RGIO) lines that are connected to the sub memory block 340 and the redundancy memory block 350 in the column redundancy scheme of FIG. 3, in greater detail. The redundancy memory block 350 in this embodiment is between the sub memory blocks 320 and 330 as shown in FIG. 3, although it is shown in FIG. 4 that the redundancy block 350 is adjacent to the sub memory block 340. This is for convenience of explanation of a redundancy scheme for replacing a defective cell within the sub memory block 340 with a redundancy memory cell in the redundancy memory block 350.

Referring to FIG. 4, the bit lines BL of the sub memory block 340 are connected to GIO<i> lines (where i=0, 2, 4, 6) via a column selection circuit 440. The column selection circuit 440 includes first, second and third selection units 441, 442 and 443. The first selection unit 441 transmits memory cell data on the bit lines BL of the sub memory block 340 to the second selection unit 442 in response to a bank selection signal BDCAij which is connected to all NMOS transistors of the first selection unit 441. The bit lines BL of the sub memory block 340 are all selected in response to the activation of the bank selection signal BDCAij.

The second selection unit 442 transmits memory cell data received via the first selection unit 441 to local data input output lines LIO<i> (where i=0, 2, 4, 6) in response to a column selection signal CSL<j> (where j is an integer from 0 to m). The column selection signal CSL<j> (where j is an integer from 0 to m) is connected to four NMOS transistors within the second selection unit 442. Four memory cell data are transmitted to four local data input output lines LIO<i> (where i=0, 2, 4, 6) in response to a single activated column selection signal CSL<j> (where j is an integer from 0 to m). The third selection unit 443 transmits four memory cell data received via the local data input output lines LIO<i> to four GIO<i> lines (where i=0, 2, 4, 6) in response to the bank selection signal BDCAij. Here, the number of GIO lines can vary according to the input output specification of a semiconductor memory device. In this embodiment, four GIO lines are provided for convenience of explanation.

The bit lines RBL of the redundancy memory block 350 are connected to RGIO<i> lines (where i=0, 2, 4, 6) via a redundancy column selection circuit 450. The redundancy column selection circuit 450 includes, for example, first, second and third redundancy selection units 451, 452 and 453 that are preferably similar to the first, second and third selection units 441, 442 and 443 of the column selection circuit 440, respectively.

The first redundancy selection unit 451 transmits redundancy memory cell data carried via the redundancy bit lines RBL of the redundancy memory block 350 to the second redundancy selection unit 452 in response to the bank selection signal BDCAij which is connected to all NMOS transistors of the first redundancy selection unit 451. The redundancy bit lines RBL of the redundancy memory block 350 are all selected in response to the activation of the bank selection signal BDCAij.

The second redundancy selection unit 452 transmits the redundancy memory cell data received via the first redundancy selection unit 451 to redundancy local data input output lines RLIO<i> (where i=0, 2, 4, 6) in response to a redundancy column selection signal RCSL<k> (where k is an integer from 0 to n). The redundancy column selection signal RCSL<k> (where k is an integer from 0 to n) is connected to four NMOS transistors within the second redundancy selection unit 452. Four redundancy memory cell data are transmitted to four redundancy local data input output lines RLIO<i> (where i=0, 2, 4, 6) in response to a single activated redundancy column selection signal RCSL<k> (where k is an integer from 0 to n).

The third redundancy selection unit 453 transmits four redundancy memory cell data received via the redundancy local data input output lines RLIO<i> (where i=0, 2, 4, 6) to the four RGIO<i> lines (where i=0, 2, 4, 6) in response to the bank selection signal BDCAij, since four memory cell data that are input and output at a time are transmitted to the four GIO lines via the column selection circuit 440. Thus, in this embodiment, four memory cells within the sub memory block 340 are deemed as a redundancy unit. In other words, if there is a defective cell among the four memory cells, all of the four memory cells are replaced with four redundancy memory cells within the redundancy memory block 350.

Figure 2:
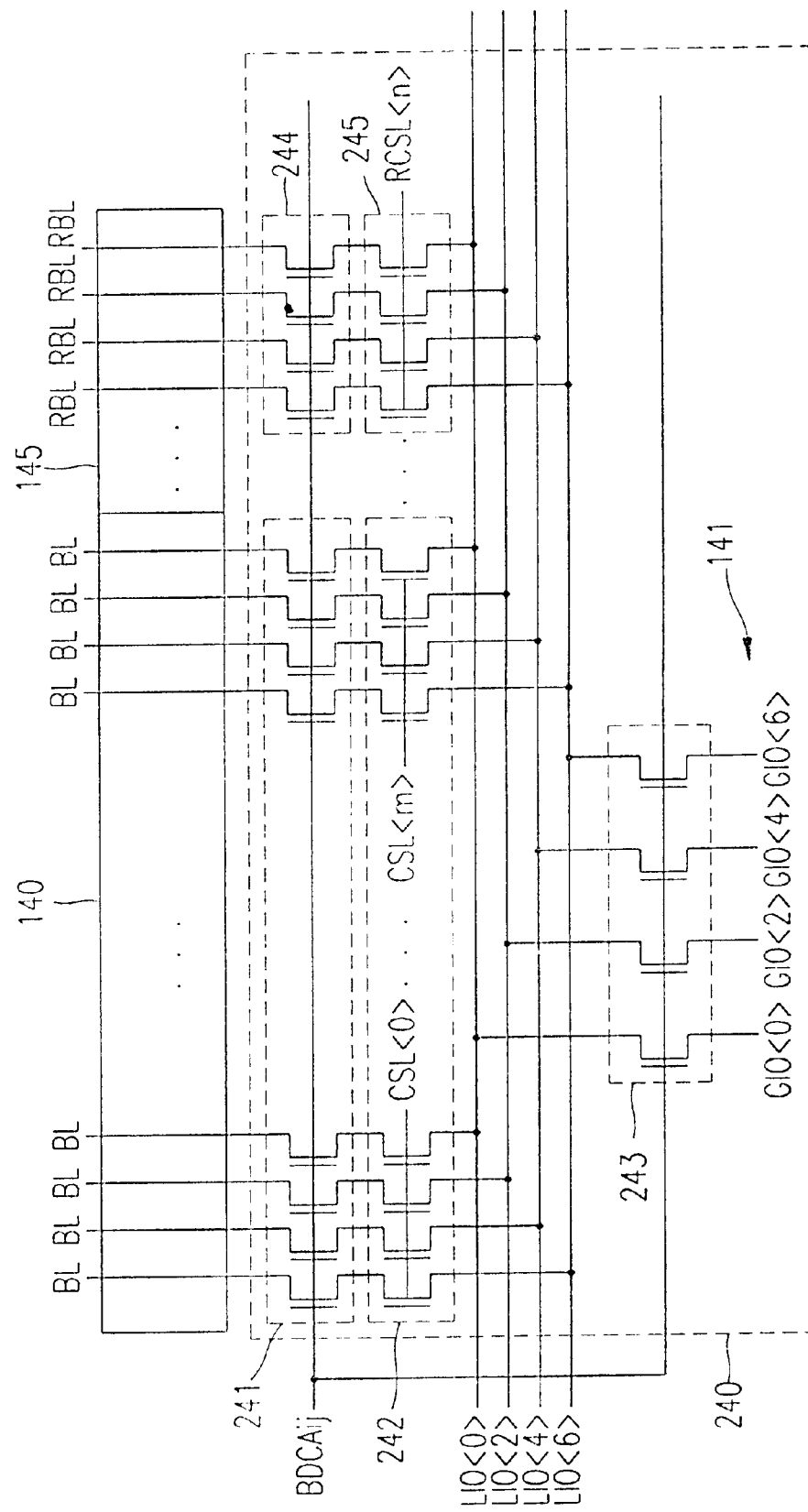
FIG. 2 shows global data input output (GIO) lines that are connected to a sub memory block and a redundancy memory block of FIG. 1, in greater detail.

In contrast with the conventional redundancy scheme in FIG. 2, the embodiment in FIG. 4 has the redundancy local data input output lines RLIO<i> (where i=0, 2, 4, 6) which are separate from the local data input output lines LIO<i> (where i=0, 2, 4, 6). Also, in this embodiment, the GIO<i> lines (where i=0, 2, 4, 6) or the RGIO<i> lines (where i=0, 2, 4, 6) are selectively connected to the data input output line 343 by the switch 342 of FIG. 3. This means that the single redundancy memory block 350 according to this embodiment can correct defective cells within the sub memory blocks 310, 320, 330 and 340, in contrast with the conventional technique (referring to FIG. 1) in which a single redundancy memory block 145 can correct only a defective cell in the sub memory block 140 adjacent to the redundancy memory block 145 since the conventional redundancy scheme employs only the local data input output lines LIO<i> (where i=0, 2, 4, 6). Therefore, the redundancy efficiency can be improved by the number of sub memory blocks.

Furthermore, this embodiment adopts the single redundancy memory block 350, so that the size of a semiconductor memory device according to the present invention can be reduced compared to a semiconductor memory device employing the conventional redundancy scheme. Such an a real reduction can be accomplished even if the redundancy memory block 350 includes many memory cells to further improve the redundancy efficiency.

SECOND EMBODIMENT

Figure 5:
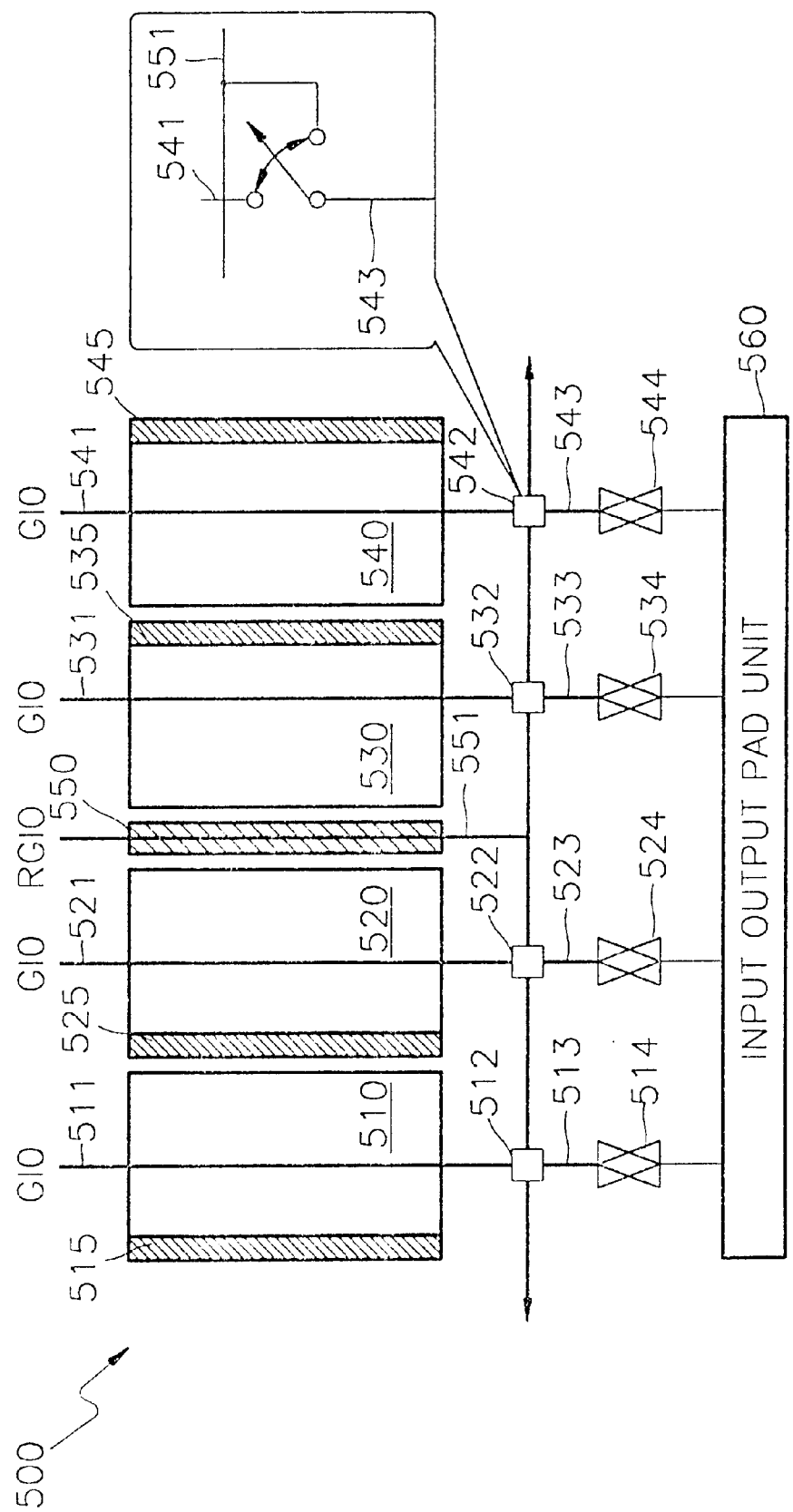
FIG. 5 shows a column redundancy scheme according to a second embodiment of the present invention.

FIG. 5 shows a column redundancy scheme according to a second embodiment of the present invention. Referring to FIG. 5, a semiconductor memory device 500 has a configuration similar to that of the semiconductor memory device 300 in FIG. 3. The semiconductor memory device 500 includes sub memory blocks 510, 520, 530 and 540, a redundancy memory block 550 and switches 512, 522, 532 and 542. One of the differences between the semiconductor memory device 500 and the semiconductor memory device 300 is that the sub memory blocks 510, 520, 530 and 540 include adjacent local redundancy memory blocks 515, 525, 535 and 545, respectively, so that defective cells in each of the sub memory blocks 510, 520, 530 and 540 are also replaced with redundancy memory cells in a corresponding local redundancy memory block using local data input output lines.

Figure 6:
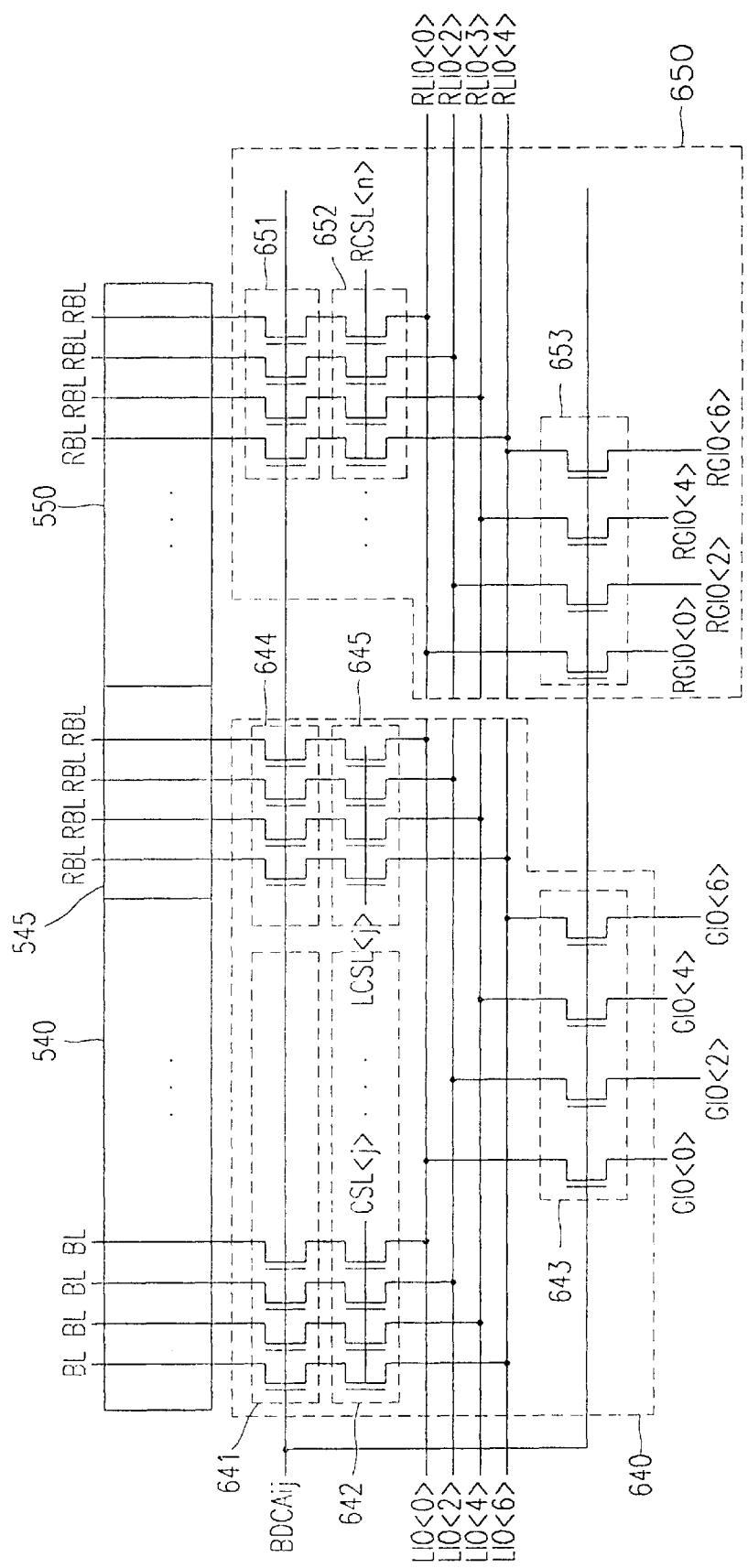
FIG. 6 shows GIO lines and RGIO lines that are connected to a sub memory block, a local redundancy memory block and a redundancy memory block of FIG. 5, in greater detail.

FIG. 6 shows GIO lines and RGIO lines that are connected to a sub memory block, a local redundancy memory block and a redundancy memory block of FIG. 5, in greater detail. The bit lines BL of the sub memory block 540 and the bit lines RBL of the local redundancy sub memory block 545 are connected to GIO<i> lines (where i=0, 2, 4, 6) by a column selection circuit 640. The column selection circuit 640 includes first, second and third selection units 641, 642 and 643, and further includes first and second local selection units 644 and 645, which constitute a local column selection circuit.

The first local selection unit 644 transmits memory cell data on the bit lines RBL of the local redundancy memory block 545 to the second local selection unit 645 in response to the bank selection signal BDCAij which is connected to all NMOS transistors of the first local selection unit 644. The bit lines RBL of the local redundancy memory block 545 are all selected in response to the activation of the bank selection signal BDCAij.

The second local selection unit 645 transmits memory cell data received via the first local selection unit 644 to local data input output lines LIO<i> (where i=0, 2, 4, 6) in response to a local column selection signal LCSL<j> (where j is an integer from 0 to m). When a memory cell connected to a bit line BL within the sub memory block 540 selected by the column selection signal CSL<j> (where j is an integer from 0 to m) is defective, the local column selection signal LCSL<j> (where j is an integer from 0 to m) is used to replace the defective cell with a memory cell of the local redundancy memory block 545. The local column selection signal LCSL<j> (where j is an integer from 0 to m) is connected to four NMOS transistors within the second local selection unit 645. Four memory cell data of the local redundancy memory block 545 are transmitted to four local data input output lines LIO<i> (where i=0, 2, 4, 6) in response to a single activated column selection signal LCSL<j> (where j is an integer from 0 to m). Since the number of memory cell data of the sub memory block 540 which are input or output at a time is set to be four by the first and second selection units 641 and 642, and the four memory cell data are transmitted to four local data input output lines LIO<i> (where i=0, 2, 4, 6), the local column selection circuit also transmits four local redundancy memory cell data to the four local data input output lines LIO<i> (where i=0, 2, 4, 6).

Data on the four local data input output lines LIO<i> (where i=0, 2, 4, 6) are transmitted to the four GIO<i> lines (where i=0, 2, 4, 6) via the third selection unit 643 in response to the bank selection signal BDCAij.

The redundancy column selection circuit 650 includes first, second and third redundancy selection units 651, 652 and 653, and connects the redundancy bit lines RBL of the redundancy memory block 550 to RGIO<i> lines (where i=0, 2, 4, 6). The redundancy column selection circuit 650 preferably has a configuration similar to that of the redundancy column selection circuit 450 of FIG. 4.

Referring back to FIG. 5, the GIO line 541 or the RGIO line 551 is selectively connected to the data input output line 543 by the switch 542.

Accordingly, four memory cells of the sub memory block 540 are deemed as a redundancy unit in this embodiment. In other words, if there is a defective cell among the four memory cells, the four memory cells are simultaneously replaced with four local redundancy memory cells in the local redundancy memory block 545 using the four local data input output lines LIO<i> (where i=0, 2, 4, 6). Defective cells not replaced with the local redundancy memory cells within the local redundancy memory block 545 are replaced with the redundancy memory cells within the redundancy memory block 550. Thus, the embodiment in FIG. 5 includes the local redundancy memory blocks 515, 525, 535 and 545 for the respective sub memory blocks 510, 520, 530 and 540 as well as the redundancy memory block 550. Although the size of a semiconductor memory device according to the embodiment in FIG. 5 may be increased compared to the embodiment in FIG. 3, the redundancy efficiency is further improved.

THIRD EMBODIMENT

Figure 7:
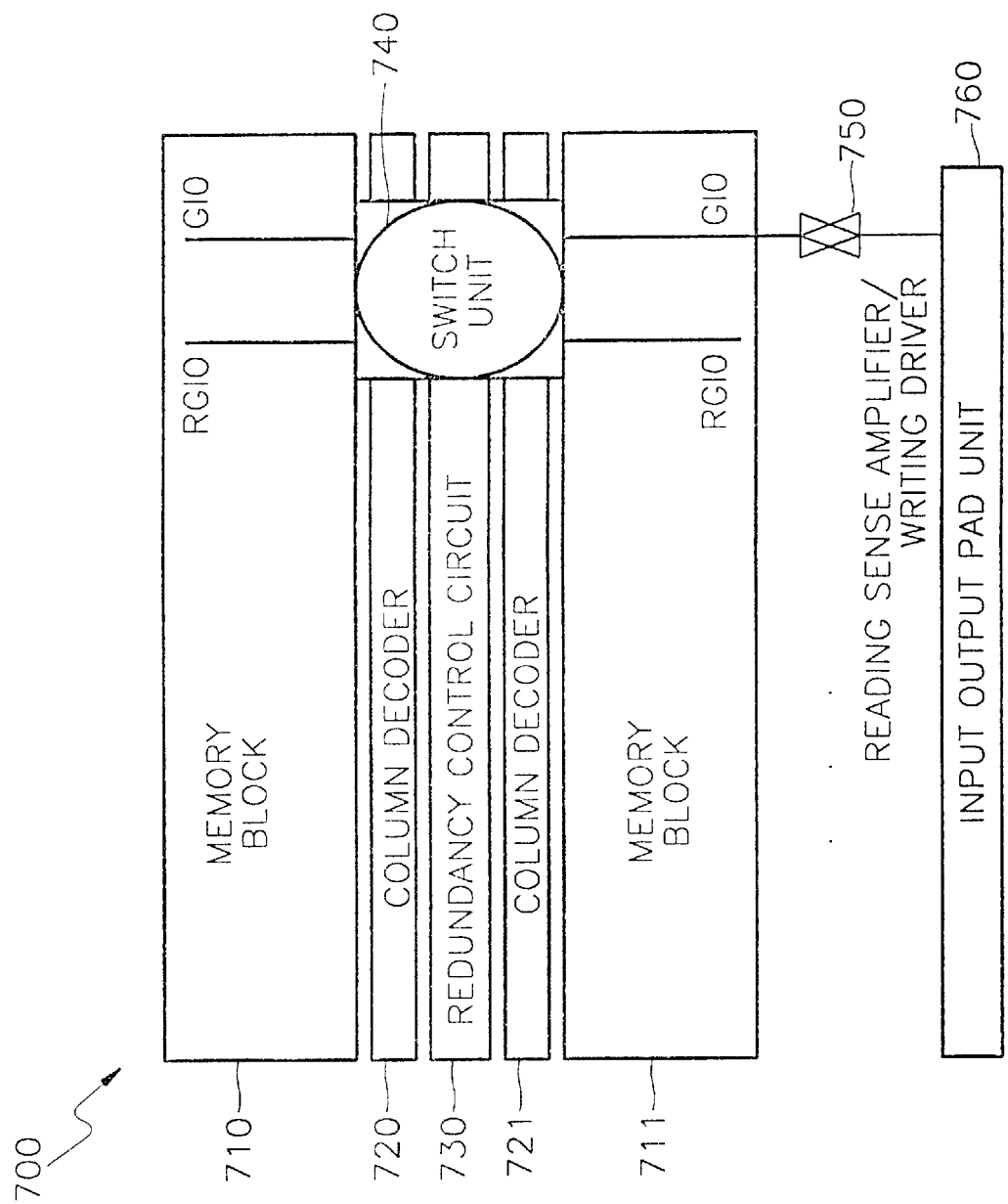
FIG. 7 is a block diagram illustrating a semiconductor memory device having a column redundancy scheme according to third and fourth embodiments of the present invention.

FIG. 7 is a block diagram illustrating a semiconductor memory device having a column redundancy scheme according to third and fourth embodiments of the present invention to be described later. Referring to FIG. 7, a semiconductor memory device 700 includes memory blocks 710 and 711 included in a memory bank, and column decoders 720 and 721 are installed between the memory blocks 710 and 711. This structure shows that the memory blocks 710 and 711 are independently activated.

Figure 10:
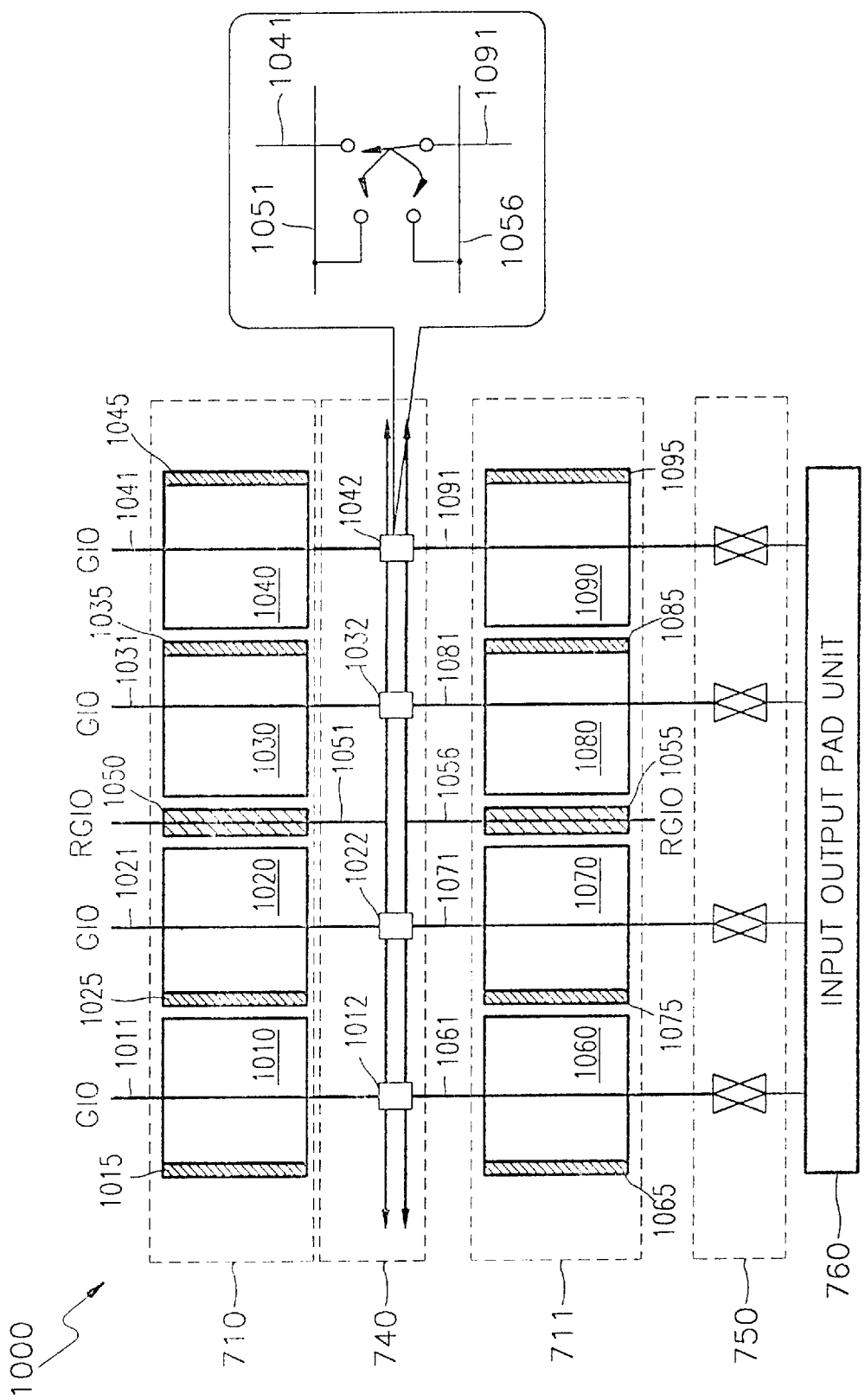
FIG. 10 shows a column redundancy scheme according to the fourth embodiment of the present invention.

Each of the memory blocks 710 and 711 includes a plurality of sub memory blocks (referring to FIG. 8), a redundancy memory block (referring to FIG. 8) and local redundancy memory blocks (referring to FIG. 10). A redundancy control circuit 730 controls the operation to replace defective cells in the sub memory blocks with the redundancy memory cells in the redundancy memory block or the local redundancy memory cells in the local redundancy memory blocks. A switch unit 740 selectively connects a GIO line carrying memory cell data of the sub memory blocks or an RGIO line carrying redundancy memory cell data of the redundancy memory block to a reading sense amplifier/writing driver 750. Preferably, the switch unit 740 is installed at the area of the column decoders 720 and 721. The reading sense amplifier/writing driver 750 senses data read from memory cells or redundancy memory cells and transmits the sensed data to an input output pad unit 760, or writes data received via the input output pad unit 760 to memory cells or redundancy memory cells.

Figure 8:
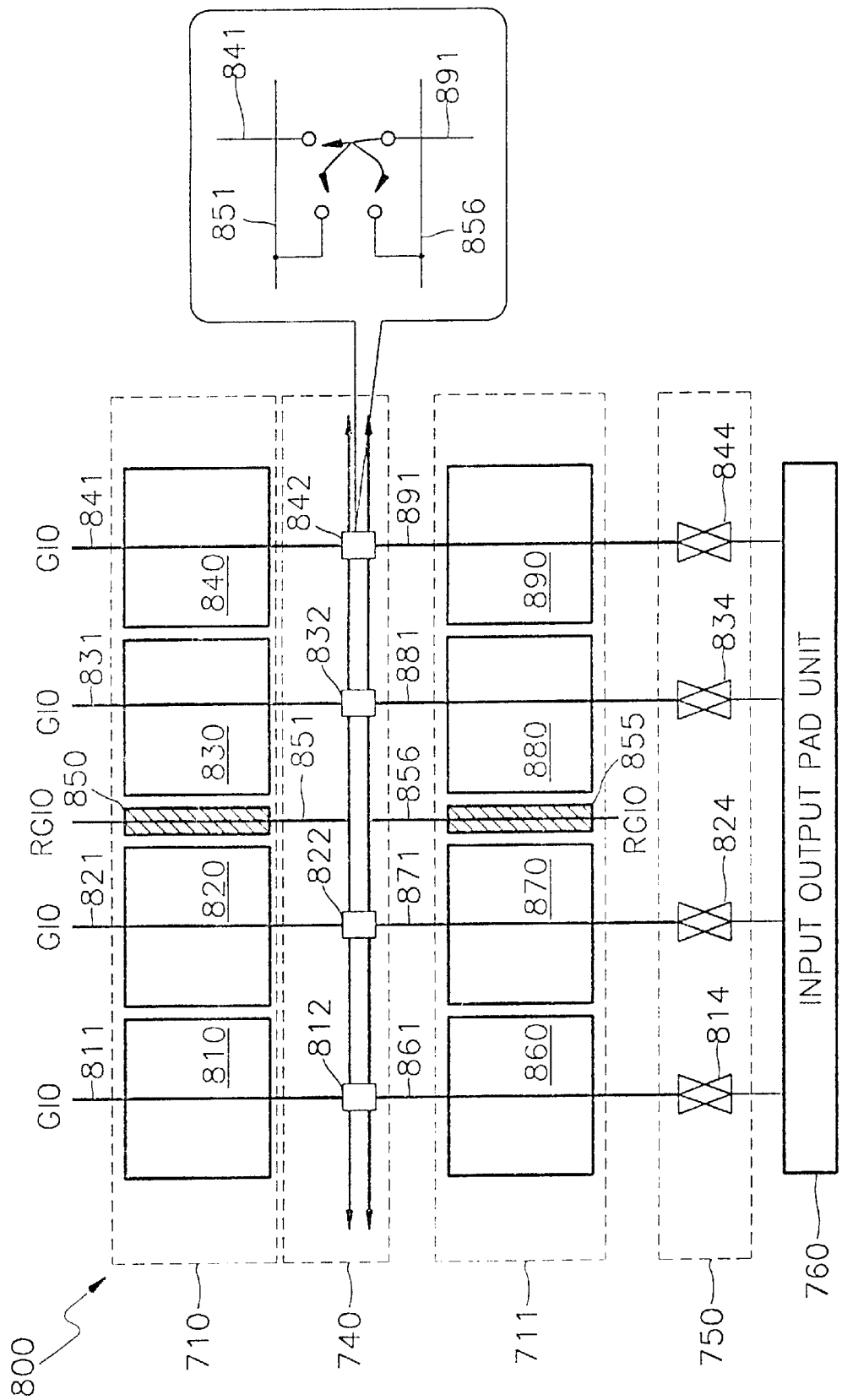
FIG. 8 shows a column redundancy scheme according to the third embodiment of the present invention.

FIG. 8 shows a column redundancy scheme 800 according to the third embodiment of the present invention. Referring to FIG. 8, an upper memory block 710 includes a plurality of sub memory blocks 810, 820, 830 and 840 and an upper redundancy memory block 850. A lower memory block 711 also includes a plurality of sub memory blocks 860, 870, 880 and 890 and a lower redundancy memory block 855. The upper and lower memory blocks 710 and 711 each preferably have a configuration similar to that of the sub memory blocks 310, 320, 330 and 340 and the redundancy memory block 350 of FIG. 3. The switch unit 740 selectively connects GIO lines or an RGIO line in each of the memory blocks to the reading sense amplifier/writing driving unit 750.

A switch 842 within the switch unit 740 is taken as an example, and its operation will be described. First, the switch 842 connects the upper GIO line 841 of the sub memory block 840 in the upper memory block 710 to the lower GIO line 891 of the sub memory block 890 in the lower memory block 711 when the upper memory block 710 is activated. Thus, memory cell data of the sub memory cell block 840 in the upper memory block 710 is transmitted to a reading sense amplifier/writing driver 844 via the upper and lower GIO lines 841 and 891. However, when a defective cell occurs in the sub memory block 840, the switch 842 switches the upper GIO line 841 to a redundancy data input output line RGIO 851 which is connected to the redundancy memory cells in the upper redundancy memory block 850. Therefore, the defective cell within the sub memory block 840 is replaced with a redundancy memory cell of the upper redundancy memory block 850.

When the lower memory block 711 is activated, the switch 842 disconnects the upper GIO line 841 from the lower GIO line 891. Thus, memory cell data of the sub memory block 890 in the lower memory block 711 is transmitted to the reading sense amplifier/writing driver 844 via the lower GIO line 891. Since the upper GIO line 841 is disconnected from the lower GIO line 891, the load on the GIO line for the reading sense amplifier/writing driver 844 is reduced, so that the memory cell data of the sub memory block 890 is transmitted fast to the reading sense amplifier/ writing driver 844. When a defective cell occurs in the sub memory block 890, the switch 842 switches the low GIO line 891 to a redundancy data input output line RGIO 856 which is connected to the redundancy memory cells in the lower redundancy memory block 855. Therefore, the defective cell within the sub memory block 890 is replaced with a redundancy memory cell of the lower redundancy memory block 855.

Figure 9:
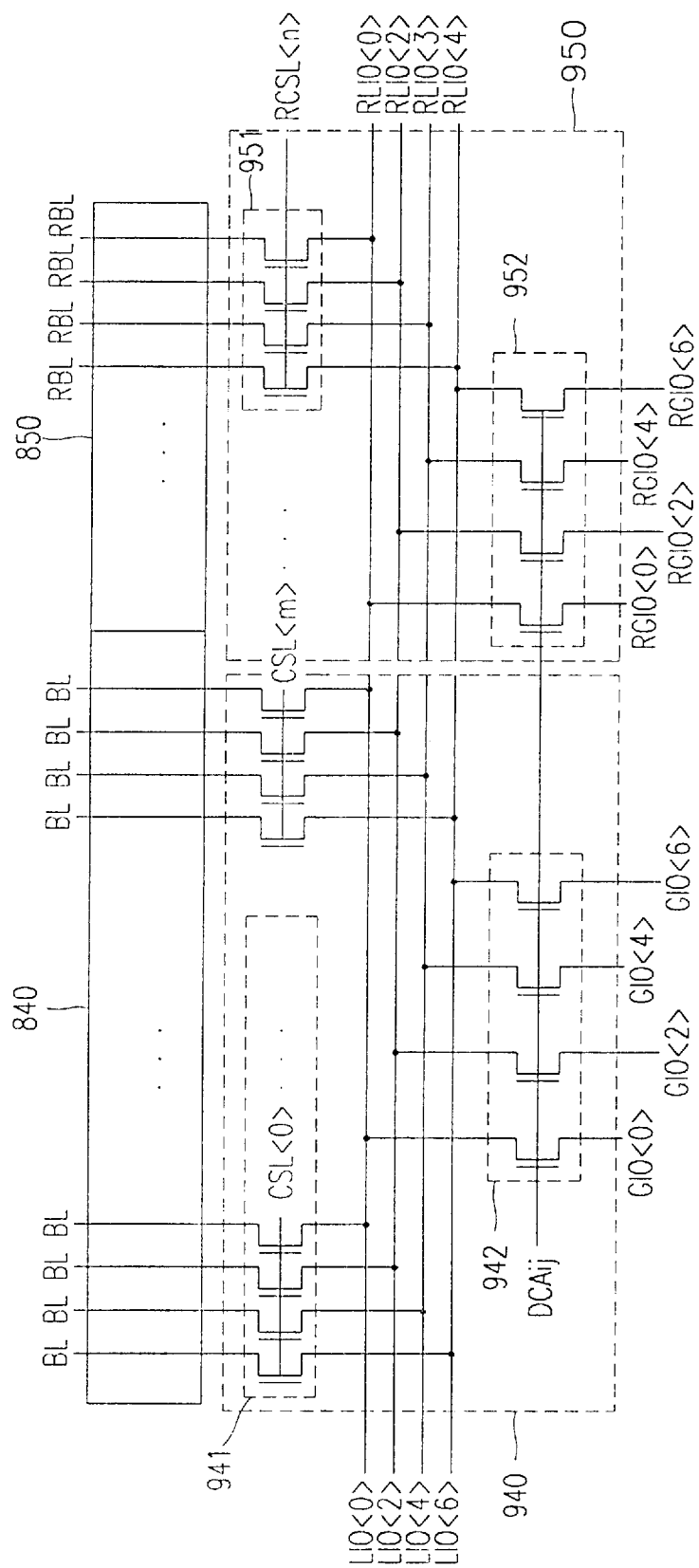
FIG. 9 shows GIO lines and RGIO lines that are connected to a sub memory block and a redundancy memory block in the column redundancy scheme of FIG. 8, in greater detail.

FIG. 9 shows GIO lines and RGIO lines connected to the sub memory block 840 and the redundancy memory block 850 in the column redundancy scheme of FIG. 8, in greater detail. Referring to FIG. 9, the bit lines BL of the sub memory block 840 are connected to GIO<i> lines (where i=0, 2, 4, 6) via a column selection circuit 940. The column selection circuit 940 includes first and second selection units 941 and 942. The first selection unit 941 selectively transmits memory cell data carried in the bit lines BL of the sub memory block 840 to local data input output lines LIO<i> (where i=0, 2, 4, 6) in response to a column selection signal CSL<j> (where j is an integer from 0 to m). Four memory cell data are transmitted to the four local data input output lines LIO<i> (where i=0, 2, 4, 6) in response to a single activated column selection signal CSL<j> (where j is an integer from 0 to m). The second selection unit 942 transmits four memory cell data received via the local data input output lines LIO<i> to four GIO<i> lines (where i=0, 2, 4, 6) in response to a block selection signal DCAij. The redundancy bit lines RBL of the redundancy memory block 850 are connected to RGIO<i> lines (where i=0, 2, 4, 6) by a redundancy column selection circuit 950. The redundancy column selection circuit 950 includes first and second redundancy selection units 951 and 952 each having, for example, four NMOS transistors. The first redundancy selection unit 951 transmits redundancy memory cell data in the redundancy memory block 850 to redundancy local data input output lines RLIO<i> (where i=0, 2, 4, 6) in response to redundancy column selection signals RCSL<k> (where k is an integer from 0 to n). Four redundancy memory cell data are transmitted to four redundancy local data input output lines RLIO<i> (where i=0, 2, 4, 6) in response to a single activated redundancy column selection signal RCSL<k> (where k is an integer from 0 to n). When, as an example, the number of memory cell data of the sub memory block 840 input or output at a time via the column selection circuit 940 is set to be four so that the four memory cell data are transmitted to four GIO lines, the redundancy column selection circuit 950 also transmits four redundancy local redundancy memory cell data to four RGIO lines.

The GIO<i> lines (where i=0, 2, 4, 6) or RGIO<i> lines (where i=0, 2, 4, 6) are selectively connected to the reading sense amplifier/writing driver 750 by the switch 842 of FIG. 8.

Compared to the column selection circuit 440 in FIG. 4, the area of the column selection circuit 940 is reduced as much as the area of the first selection unit 441 in the column selection circuit 440. Also, the column selection circuit 940 is preferably arranged near the column decoder of each of the memory blocks, so that the entire area of a semiconductor memory device is significantly reduced.

FOURTH EMBODIMENT

FIG. 10 shows a column redundancy scheme according to a fourth embodiment of the present invention. Compared to the semiconductor memory device 800 in FIG. 8, a semiconductor memory device 1000 of FIG. 10 has memory blocks in that sub memory blocks 1010, 1020, 1030 and 1040 of an upper memory block 710 and sub memory blocks 1060, 1070, 1080 and 1090 of a lower memory block 711 include local redundancy memory blocks 1015, 1025, 1035, 1045, 1065, 1075, 1085 and 1095, respectively. The sub memory blocks 1010, 1020, 1030 and 1040 of the upper memory block 710 and the sub memory blocks 1060, 1070, 1080 and 1090 of the lower memory block 711 are preferably similar to the sub memory blocks 515, 525, 535 and 545 of FIG. 5.

A switch unit 740 operates similar to that of FIG. 8. The switch 1042 connects the upper GIO line 1041 of the sub memory block 1040 in the upper memory block 710 to the lower GIO line 1091 of the sub memory block 1090 in the lower memory block 711 when the upper memory block 710 is activated. When the lower memory block 711 is activated, the switch 1042 disconnects the upper GIO line 1041 from the lower GIO line 1091. When a defective cell occurs in the sub memory block 1040, the switch 1042 switches the upper GIO line 1041 to a redundancy data input output line RGIO 1051 connected to the redundancy memory cells of a first redundancy memory block 1050. When a defective cell occurs in the sub memory block 1090, the switch 1042 switches the lower GIO line 1091 to a redundancy data input output line RGIO 1056 connected to the redundancy memory cells of a second redundancy memory block 1055.

Figure 11:
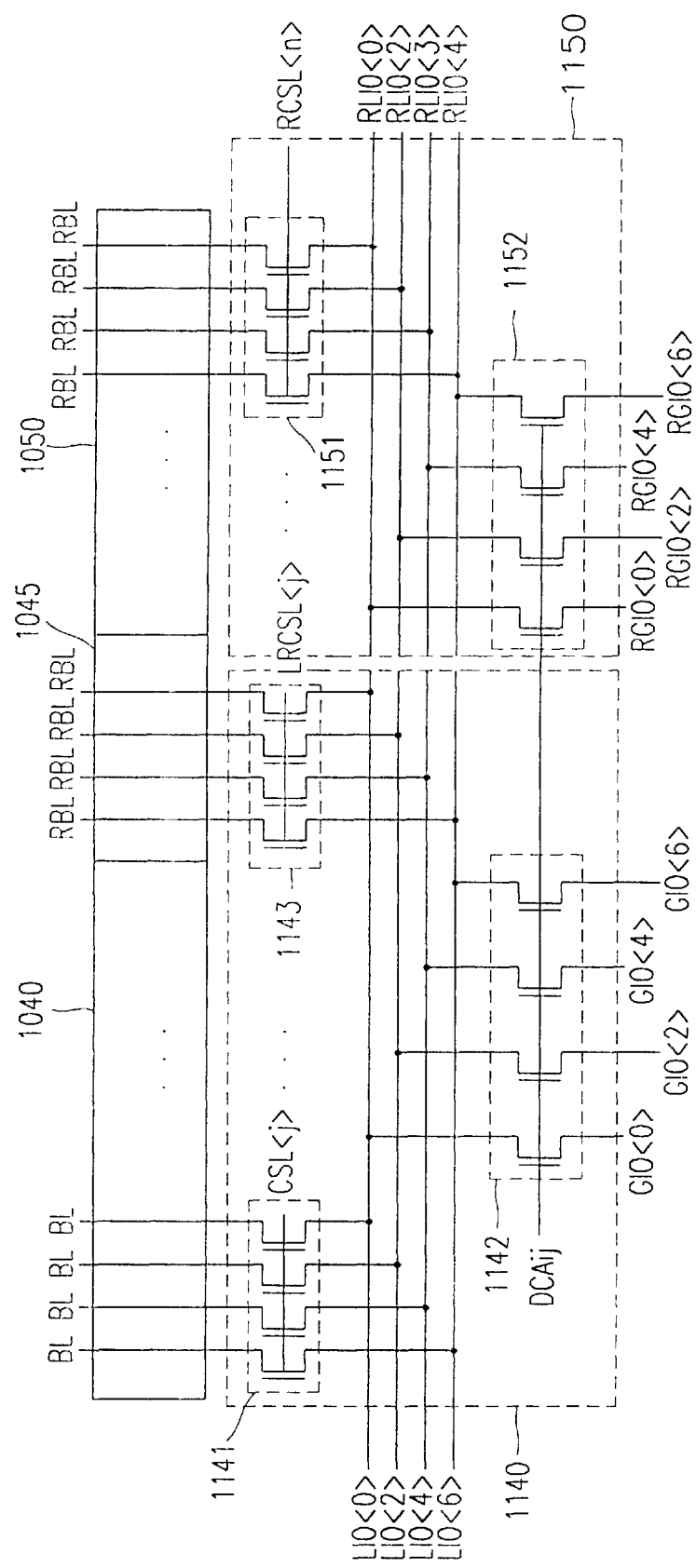
FIG. 11 shows GIO lines and RGIO lines that are connected to a sub memory block, a local redundancy memory block and a redundancy memory block in the column redundancy scheme of FIG. 10, in greater detail.

FIG. 11 shows GIO lines and RGIO lines that are connected to a sub memory block, a local redundancy memory block and a redundancy memory block in the column redundancy scheme of FIG. 10, in greater detail. The bit lines BL of the sub memory block 1040 and the redundancy bit lines RBL of the local redundancy memory block 1045 are connected to GIO<i> lines (where i=0, 2, 4, 6) by a column selection circuit 1140. The column selection circuit 1140 includes first and second selection units 1141 and 1142 that are preferably the same as the first and second selection units 941 and 942 of the column selection circuit 940 of FIG. 9. The column selection circuit 1140 further includes a local selection unit 1143 that constitutes a local column selection circuit.

The local selection unit 1143 transmits memory cell data in the local redundancy memory block 1045 to local data input output lines LIO<i> (where i=0, 2, 4, 6) in response to a local column selection signal LCSL<j> (where j is an integer from 0 to m). When a memory cell connected to a bit line BL within the sub memory block 1040 selected by the column selection signal CSL<j> (where j is an integer from 0 to m) is defective, the local column selection signal LCSL<j> (where j is an integer from 0 to m) is used to replace the defective cell with a redundancy memory cell of the local redundancy memory block 1045. Data on the local data input output lines LIO<i> (where i=0, 2, 4, 6) are transmitted to four GIO<i> lines (where i=0, 2, 4, 6) via the second selection unit 1142 in response to a block selection signal DCAij.

The redundancy column selection circuit 1150 includes first and second redundancy selection units 1151 and 1152, and is similar to the redundancy column selection circuit 950 of FIG. 9. Thus, the description regarding the same parts is omitted to avoid duplicate explanation.

In this embodiment, the area occupied by the column selection circuit 1140 and the redundancy column selection circuit 1150 is reduced compared to the area occupied by the column selection circuit 640 and the redundancy column selection circuit 650 of FIG. 6. Thus, the entire area of a semiconductor memory device according to this embodiment is significantly reduced.

Therefore, by using the column redundancy scheme with the switch unit according to the present invention, the size of a semiconductor memory device is reduced, while the redundancy efficiency of the semiconductor memory device is increased.

Although the invention has been described with reference to particular embodiments, it will be apparent to one of ordinary skill in the art that modifications to the described embodiments may be made without departing from the spirit and scope of the invention.

What is claimed is:

1. A semiconductor memory device comprising:
    a plurality of sub memory blocks having a plurality of memory cells;
    a redundancy memory block having a plurality of redundancy memory cells;
    a global data input output line for carrying data of selected memory cells of a sub memory block;
    a redundancy global data input output line for carrying data of selected redundancy memory cells of the redundancy memory block; and
    a switch for switching the global data input output line to the redundancy global data input output line if a memory cell connected to the global data input output line is defective.

2. The semiconductor memory device of claim 1, wherein the plurality of sub memory blocks are associated with a plurality of global data input output lines, respectively, each of which carries data of selected memory cells in a corresponding sub memory block, and the plurality of global data input output lines are connected to a plurality of switches, respectively, each of which switches a corresponding global data input output line to the redundancy global data input output line when a defective memory cell is connected to the corresponding global data input output line.

3. The semiconductor memory device of claim 2, further comprising a switch controller for controlling the plurality of switches to correct defective memory cells in the plurality of sub memory blocks with corresponding redundancy memory cells in the redundancy memory block.

4. The semiconductor memory device of claim 1, further comprising a reading sense amplifier/writing driver which is connected to the global data input output line or the redundancy global data input output line via the switch.

5. The semiconductor memory device of claim 1, further comprising a column selection circuit for connecting bit lines of memory cells of a sub memory block to a corresponding global data input output line, wherein the column selection circuit comprises:
    a first selection unit for transmitting data on the bit lines of the memory cells of the sub memory block in response to a bank selection signal for selecting the sub memory block;
    a second selection unit for transmitting outputs of the first selection unit to a local data input output line in response to a column selection signal; and
    a third selection unit for transmitting data on the local data input output line to the corresponding global data input output line in response to the bank selection signal.

6. The semiconductor memory device of claim 1, further comprising a redundancy column selection circuit for connecting redundancy bit lines of redundancy memory cells of the redundancy memory block to the redundancy global data input output line, wherein the redundancy column selection circuit comprises:
    a first redundancy selection unit for transmitting data on the redundancy bit lines of the redundancy memory cells of the redundancy memory block in response to a bank selection signal for selecting a sub memory block;
    a second redundancy selection unit for transmitting outputs of the first redundancy selection unit to a local redundancy data input output line in response to a redundancy column selection signal; and
    a third redundancy selection unit for transmitting data on the local data input output line to the redundancy global data input output line in response to the bank selection signal.

7. The semiconductor memory device of claim 1, wherein a predetermined number of redundancy bit lines of the redundancy memory block are connected to the redundancy global data input output line and the predetermined number of bit lines of the sub memory block are connected to the global data input output line, data on the predetermined number of bit lines being replaced with data on the predetermined redundancy bit lines by switching the global data input output line to the redundancy global data input output line.

8. A semiconductor memory device comprising:
    a plurality of sub memory blocks having a plurality of memory cells;
    local redundancy memory blocks having a plurality of local redundancy memory cells, each of the local redundancy memory blocks being adjacent to each of the sub memory blocks;
    a redundancy memory block having a plurality of redundancy memory cells;

a global data input output line for carrying data of selected memory cells of a sub memory block or data of selected local redundancy memory cells of a local redundancy memory block;

a redundancy global data input output line for carrying data of selected redundancy memory cells of the redundancy memory block; and a switch for switching the global data input output line to the redundancy global data input output line if a memory cell connected to the global data input output line is defective.

9. The semiconductor memory device of claim 8, wherein each of a plurality of switches is connected to a corresponding global data input output line and the redundancy global data input output line, and each switch switches the corresponding global data input output line to the redundancy global data input output line when a defective memory cell connected to the corresponding global data input output line is not replaced with a corresponding local redundancy memory cell in a local redundancy memory block.

10. The semiconductor memory device of claim 9, further comprising a switch controller for controlling the plurality of switches to correct defective memory cells in the plurality of sub memory blocks with corresponding redundancy memory cells in the redundancy memory block.

11. The semiconductor memory device of claim 8, further comprising a reading sense amplifier/writing driver which is connected to the global data input output line or the redundancy global data input output line via the switch.

12. The semiconductor memory device of claim 8, further comprising a column selection circuit for connecting bit lines of memory cells of a sub memory block to a corresponding global data input output line, wherein the column selection circuit comprises:

a first selection unit for transmitting data on the bit lines of the memory cells of the sub memory block in response to a bank selection signal for selecting the sub memory block;

a second selection unit for transmitting outputs of the first selection unit to a local data input output line in response to a column selection signal; and a third selection unit for transmitting data on the local data input output line to the corresponding global data input output line in response to the bank selection signal.

13. The semiconductor memory device of claim 12, further comprising a local column selection circuit for connecting redundancy bit lines of local redundancy memory cells of a local redundancy memory block to the local data input output line, wherein the local column selection circuit comprises:

a first local selection unit for transmitting data on the redundancy bit lines of the local redundancy memory cells of the local redundancy memory block in response to the bank selection signal; and a second local selection unit for transmitting outputs of the first local selection unit to the local data input output line in response to a local column selection signal.

14. The semiconductor memory device of claim 8, further comprising a redundancy column selection circuit for connecting redundancy bit lines of redundancy memory cells of the redundancy memory block to the redundancy global data input output line, wherein the redundancy column selection circuit comprises:

a first redundancy selection unit for transmitting data on the redundancy bit lines of the redundancy memory cells of the redundancy memory block in response to a bank selection signal for selecting a sub memory block;

a second redundancy selection unit for transmitting outputs of the first redundancy selection unit to a local redundancy data input output line in response to a redundancy column selection signal; and a third redundancy selection unit for transmitting data on the local redundancy data input output line to the redundancy global data input output line in response to the bank selection signal.

15. A semiconductor memory device comprising:

an upper memory block;

a lower memory block;

a plurality of sub memory blocks having a plurality of memory cells, the plurality of sub memory blocks included in each of the upper and lower memory blocks;

a column decoder connected to each of the upper and lower memory blocks for addressing bit lines of the memory cells within the sub memory blocks;

a redundancy memory block having a plurality of redundancy memory cells, the redundancy memory block included in each of the upper and lower memory blocks;

a global data input output line for carrying data of selected memory cells of a sub memory block;

a redundancy global data input output line for carrying data of selected redundancy memory cells of the redundancy memory block; and a switch for switching the global data input output line to the redundancy global data input output line if a memory cell connected to the global data input output line is defective.

16. The semiconductor memory device of claim 15, wherein a plurality of switches are connected with a plurality of global data input output lines each of which is associated with a corresponding one of the plurality of sub memory blocks in the upper and lower memory block, each switch being connected with a global data input output line and a redundancy global data input output line of the upper memory block and a global data input output line and a redundancy global data input output line of the lower memory block.

17. The semiconductor memory device of claim 16, wherein the plurality of switches are installed at an area of the column decoder.

18. The semiconductor memory device of claim 16, further comprising a switch controller for controlling the plurality of switches, wherein the switch controller connects the global data input output line of the upper memory block to the global data input output line of the lower memory block if the upper memory block is selected, and disconnects the global data input output line of the upper memory block from the global data input output line of the lower memory block if the lower memory block is selected.

19. The semiconductor memory device of claim 15, further comprising a reading sense amplifier/writing driver which is connected to the global data input output line or the redundancy global data input output line via the switch.

20. The semiconductor memory device of claim 15, further comprising a column selection circuit for connecting bit lines of memory cells of a sub memory block to a corresponding global data input output line, wherein the column selection circuit comprises:

a first selection unit for transmitting data on the bit lines of the memory cells of the sub memory block to a local data input output line in response to a column selection signal; and a second selection unit for transmitting data on the local data input output line to the corresponding global data input output line in response to a block selection signal.

21. The semiconductor memory device of claim 15, further comprising a redundancy column selection circuit for connecting redundancy bit lines of redundancy memory cells of a redundancy memory block to a corresponding redundancy global data input output line, wherein the redundancy column selection circuit comprises:

a first redundancy selection unit for transmitting data on the redundancy bit lines of the redundancy memory block to a local redundancy data input output line in response to a redundancy column selection signal; and a second redundancy selection unit for transmitting data on the local redundancy data input output line to the corresponding redundancy global data input output line in response to a block selection signal.

22. A semiconductor memory device comprising:

an upper memory block;

a lower memory block;

a plurality of sub memory blocks having a plurality of memory cells, the plurality of sub memory blocks included in each of the upper and lower memory blocks;

local redundancy memory blocks each having a plurality of local redundancy memory cells, the local redundancy memory blocks included in each of the upper and lower memory blocks;

a redundancy memory block having a plurality of redundancy memory cells, the redundancy memory block included in each of the upper and lower memory blocks;

a column decoder connected to each of the upper and lower memory blocks for addressing bit lines of the memory cells within the sub memory blocks;

a global data input output line for carrying data of selected memory cells of a sub memory block;

a redundancy global data input output line for carrying data of selected redundancy memory cells of the redundancy memory block; and a switch for switching the global data input output line to the redundancy global data input output line if a memory cell connected to the global data input output line is defective.

23. The semiconductor memory device of claim 22, wherein a plurality of switches are connected with a plurality of global data input output lines each of which is associated with a corresponding one of the plurality of sub memory blocks in the upper and lower memory block, each switch being connected with a global data input output line and a redundancy global data input output line of the upper memory block and a global data input output line and a redundancy global data input output line of the lower memory block.

24. The semiconductor memory device of claim 23, wherein the plurality of switches are installed at an area of the column decoder.

25. The semiconductor memory device of claim 23, further comprising a switch controller for controlling the plurality of switches, wherein the switch controller connects the global data input output line of the upper memory block to the global data input output line of the lower memory block if the upper memory block is selected, and disconnects the global data input output line of the upper memory block from the global data input output line of the lower memory block if the lower memory block is selected.

26. The semiconductor memory device of claim 22, further comprising a reading sense amplifier/writing driver which is connected to the global data input output line or the redundancy global data input output line via the switch.

27. The semiconductor memory device of claim 22, further comprising:

a column selection circuit for connecting bit lines of memory cells of a sub memory block to a corresponding global data input output line, wherein the column selection circuit comprises:

a first selection unit for transmitting data on the bit lines of the memory cells of the sub memory block to a local data input output line in response to a column selection signal; and a second selection unit for transmitting data on the local data input output line to the corresponding global data input output line in response to a block selection signal; and a local column selection circuit for connecting redundancy bit lines of local redundancy memory cells of a local redundancy memory block to the local data input output line, wherein the local column selection circuit comprises a local selection unit for transmitting data on the redundancy bit lines of the local redundancy memory cells of the local redundancy memory block to the local data input output line in response to a local column selection signal.

28. The semiconductor memory device of claim 22, further comprising a redundancy column selection circuit for connecting redundancy bit lines of redundancy memory cells of the redundancy memory block to the redundancy global data input output line, wherein the redundancy column selection circuit comprises:

a first redundancy selection unit for transmitting data on the redundancy bit lines of the redundancy memory block to a local redundancy data input output line in response to a redundancy column selection signal; and a second redundancy selection unit for transmitting data on the local redundancy data input output line to the redundancy global data input output line in response to a block selection signal.

* * * * *